US006075422A

United States Patent [19]

Harris

[11] Patent Number: 6,075,422

[45] Date of Patent: Jun. 13, 2000

[54] APPARATUS FOR OPTIMIZATION OF MICROWAVE PROCESSING OF INDUSTRIAL MATERIALS AND OTHER PRODUCTS

[75] Inventor: George M. Harris, Lewiston, Me.

[73] Assignee: R.F. Technologies, Inc., Lewiston, Me.

[21] Appl. No.: 09/087,875

[22] Filed: Jun. 1, 1998

[51] Int. Cl.[7] .............................. H03H 7/40; H01P 1/207

[52] U.S. Cl. .......................... 333/17.3; 333/209; 333/253

[58] Field of Search ............................ 333/17.3, 33, 208, 333/209, 253

[56] References Cited

U.S. PATENT DOCUMENTS

| | | | |
|---|---|---|---|
| 2,526,579 | 10/1950 | Ring | 333/253 |
| 3,164,792 | 1/1965 | Georgiev et al. | 333/209 |
| 5,079,507 | 1/1992 | Ishida et al. | 333/17.3 X |
| 5,629,653 | 5/1997 | Stimson | 333/17.3 |
| 5,670,918 | 9/1997 | Umezu | 333/33 |

FOREIGN PATENT DOCUMENTS

| | | | |
|---|---|---|---|
| 1181341 | 11/1964 | Germany | 333/209 |

OTHER PUBLICATIONS

G.C. Southworth, *Principles and Applications of Waveguide Transmission*, Van Nostrand Co., Princeton, N.J., Title Page & p. 261 Relied On; QC661568, 1950.

*Primary Examiner*—Paul Gensler
*Attorney, Agent, or Firm*—Lightbody & Lucas

[57] ABSTRACT

A high power microwave or radio frequency network is disclosed which utilizes [2] two movable capacitive probes in order to provide complete vector tuning [in 4 axis by] utilizing the capacitive reactance of the two capacitive probes to provide [2] two tuning axis and the inductive reactance of two fixed inductive posts to provide [the] two additional [axis] axes of tuning, thereby allowing four axes of tuning with the movement of only two members, the capacitive probes. A third capacitive probe/inductive post set can be added to the two probe configuration for extremely high reflection correction at all phase angles.

22 Claims, 5 Drawing Sheets

APPARATUS FOR OPTIMIZATION OF MICROWAVE PROCESSING OF INDUSTRIAL MATERIALS AND OTHER PRODUCTS

FIELD OF THE INVENTION

This invention relates to a tuning system for microwave and other high energy electromagnetic treatment systems.

BACKGROUND OF THE INVENTION

High power microwave and radio frequency networks are used to provide energy for heating, curing, sterilizing, medical imaging, medical therapy, plasma generating, and other processing of substrates or treated medium. The goal for such processing is to optimize the process. This typically means utilizing the least input energy to completely process the maximum process substrate in an efficient manner and controlling the match between the electromagnetic field to such substrate (which may change as the process is carried out). The applications are primarily high power microwave and/or radio frequency energy utilization including the food service industry, medical applications, the heating of manufactured products such as composite material production, the hydrogenation of petroleum products for octane boosting, plasma systems for the electronics industry, and others.

In a typical device, an electromagnetic generator is located on the opposite end of a waveguide from a load. The waveguide itself can have a rectangular, circular, or other cross section, the selection of which is dependent on the system design and desired mode or electromagnetic field map. The tuning mechanism is itself selected in consideration of the waveguide and mode.

Traditionally three, four, or five complete and separate capacitive probes separated by an electrical distance along the transmission line were required. In this traditional approach, for a given reference position on the line, one probe was actuated in order to introduce capacitive reactance, and a second separate probe was needed in order to introduce the other required inductive reactance parameter. This inductive/capacitive reactance control parameter, however, provides only one of the two required in order to obtain a full range of adjustment latitude required in a system using high power radio frequency or microwave processes.

For this reason, in order to implement a complete tuner network, a second and completely independent set of inductive and capacitive adjustments must be included. (This second set of inductive/capacitive elements is identical to the ones previously described herein.)

In prior waveguide devices, for a full range of adjustment, preferably two pair of two probes (four probes in total) are required (rectangular waveguide example in FIG. 6). (While it is possible to have three probe tuner implementations using capacitive probes, these devices cover only three axes and not four, thus compromising overall performance and tuning range.) This traditional probe approach requires four independent capacitive probe drive mechanisms 100, 101, 102, 103. In addition, the four probes must be spaced apart along the line or waveguide in order to allow the tuner to synthesize all four axes. The spacing 105, 106, 107 is a precise ⅝ electrical waveguide wavelength along the tuner. Since there are four probes on this traditional network, the three spaces 105, 106, 107 between the capacitive probes must be tightly controlled to maintain their relative separation. This type of tuner is therefore sensitive to operational changes in frequency, as the ⅝ wavelength spacing is only actually available at a single frequency for a fixed geometry network. This four probe tuner is therefore quite sensitive in initial setup and in subsequent operation. In addition, the successive ⅝ wavelength spacings, as they relate to frequency, are additive increasing the frequency sensitivity. This four probe tuner is also quite lengthy (at least three times the space between adjacent probes each separated substantially equally; i.e., about 34+½" in a 915 mHz. device).

Other cross section waveguides have equivalent design and operation limitations.

OBJECTS AND SUMMARY OF THE INVENTION

Microwave processing can be used in a large variety of applications, some of which have been described above. This particular invention covers a new, simple, cost effective implementation of an electromagnetic network that can tolerate the extremely high power electromagnetic field levels that are commonly required in industrial and scientific microwave systems while, at the same time, synthesizing over wide latitudes, under automatic or manual control, all of the required electrical parameters necessary to compensate for the changing characteristics that almost always accompany any radio frequency or microwave process.

It is an object of this invention to increase the efficiency of microwave processing.

It is another object of this invention to reduce the complexity of microwave processing.

It is a further object of this invention to reduce the cost of microwave processing.

It is still a further object of this invention to reduce the number of probes needed to control microwave processing, decreasing frequency sensitivity, increasing stability and tuning latitude.

Other objects and a more complete understanding of the invention may be had by referring to the following drawings in which:

DETAILED DESCRIPTION OF THE INVENTION

There are many applications emerging where high power microwave and radio frequency energy is used, implementing much more complete, efficient and thorough processing required for a large variety of commercial, industrial, medical and research applications. Some of these applications include heating, curing, processing, sterilizing, medical imaging, medical therapy, plasma generation for the production of integrated circuits, as well as for other purposes. Other applications include processes such as microwave enhanced chemistry for still a further and more diverse application base. The actual application and implementation of this technology involves surmounting a number of engineering obstacles. One particular characteristic that always faces microwave physicists, engineers and designers of these systems involves the electrical or electromagnetic interface directly between the microwave or radio frequency energy that actually enters and works on the treated medium. This quality or characteristic is commonly referred to as the match between the electromagnetic fields in the microwave or radio frequency energy and the process substrate. In most applications, as the various processes are carried out, the process itself will change the match between the microwave or radio frequency energy that is incident on the treated substrate as the energy is reflected away from this substrate and wasted. This wasted energy not only results in increasing inefficiency, and the strong likelihood of less than optimum process results, but in some cases can also lead to damage to the microwave or radio frequency generation equipment.

This present invention covers a new network that can be used in a system to implement a means to dynamically track and adjust the microwave or radio frequency application system so as to maintain optimum match conditions within the system over a wide and dynamically changing variety of process situations. In the present invention, inductive members are utilized in addition to capacitive members in order to tune the network. This electromagnetic network can tolerate the extremely high power electromagnetic field levels that are commonly required in microwave systems, while at the same time, synthesizing, under automatic control or manually, all of the required electrical parameters necessary to compensate for the changing characteristics that almost always accompany any radio frequency or microwave process.

Figure 4:
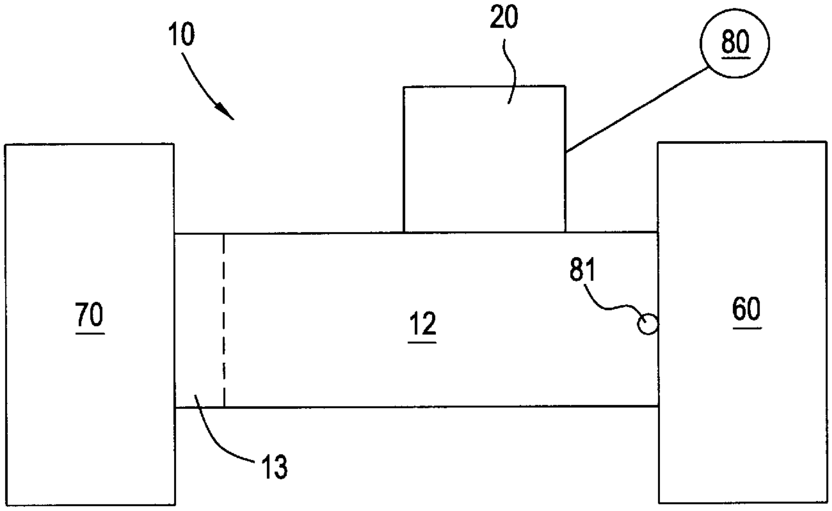
FIG. 4 is a drawing of a representational microwave network controlled by the invention.

Although the invention can be utilized with any shape waveguide, such as circular waveguide, it will be described in an example rectangular waveguide embodiment. In this embodiment, the tuning mechanism is directed to controlling the dominant rectangular waveguide mode or electromagnetic field wave propagation profile. Whatever the waveguide configuration, the microwave network 10 is implemented using capacitive probes that are placed in a tuner section 20 in the transmission path 12 between the microwave or radio frequency generator 60 that produces the energy, and the load 70 that absorbs this energy in processing (FIG. 4). These probes are mechanically actuated, either automatically or manually, both in response to real time continuous electrical measurement of the quality of the electromagnetic match between the radio frequency or microwave energy and the process substrate, typically under the control of a computer 80 itself connected between a sensor 81 and the electrically controlled probes. The exact nature of the probes depend on the waveguide shape and mode definition.

In the network an electromagnetic generator 60 operates along a transmission path including a waveguide 12 to manipulate some sort of process substrate 70 (load). In this network any energy that is reflected is not utilized. Therefore, ideally, the reflected energy is adjusted to minimize such (preferably to zero) so as to match the electromagnetic field to the process. The electrical parameters of the network, primarily the inductive and capacitive components, therefore, are preferably adjusted so that the vector qualities, including phase angle and length, are actively controlled. An example of this is presented in FIG. 4 (later described).

The microwave source 60 is the source of electromagnetic energy for the device. Typically, this will be a 915 mHz U.S. standard microwave source. It may vary from 10–10,000 mHz. The power of the microwave source is not limited to any particular extent. The purpose of this microwave source is to provide the energy to process the load.

The load 70 is the application wherein the energy from the electromagnetic source is utilized. The basic attribute of this load 70 is that it absorbs the energy from the electromagnetic network and preferentially transforms it into another type of energy, typically heat. This transformation operates on the load 70 to alter the state of the load from one level to another level as per a particular design application.

The waveguide 12 interconnects the electromagnetic source 60 with the load 70. The waveguide itself is designed to contain the power of the electromagnetic source, thus to transfer the power thereof to the load. It also can aid in defining the mode definitions for the network. In this respect, also note that an applicator 13 may be included between the electromagnetic source 60 and the waveguide 12 and/or the waveguide 12 and the load 70 in order to transform the energy from direct to angular, from one aspect to another (such as rectangular to circular), or otherwise as known in the art. If this is the case, it may be necessary to add compensating structures in the return path in order for the later described sensor mechanism to accurately control the device.

Figure 1:
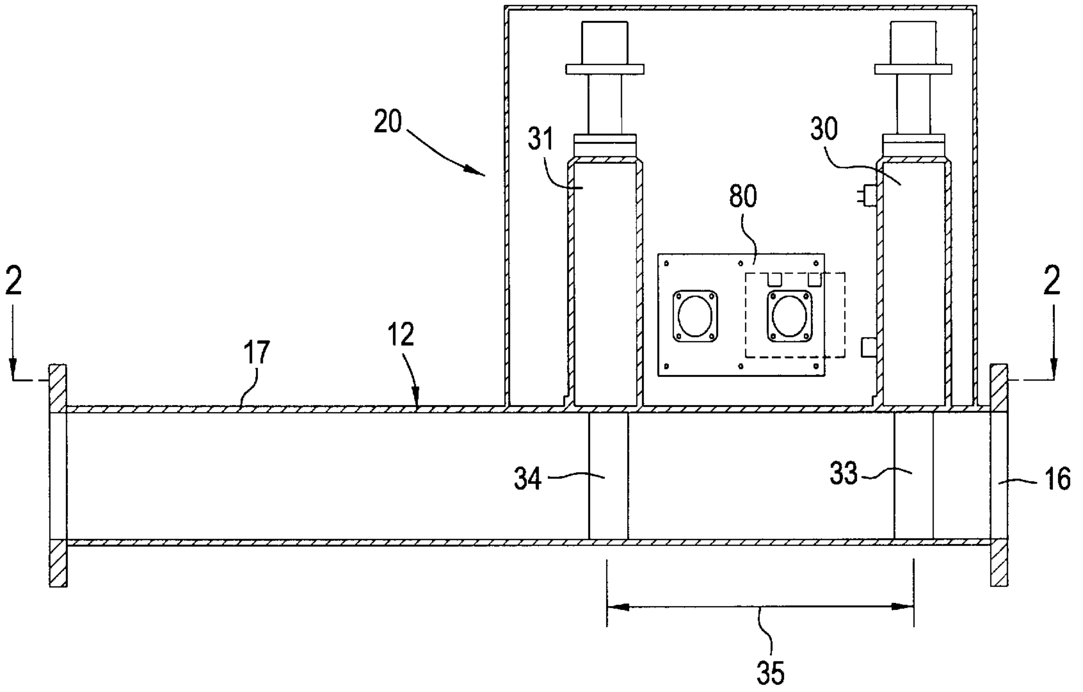
FIG. 1 is a longitudinal cross-sectional side view of a rectangular waveguide tuner section incorporating the invention.
Figure 2:
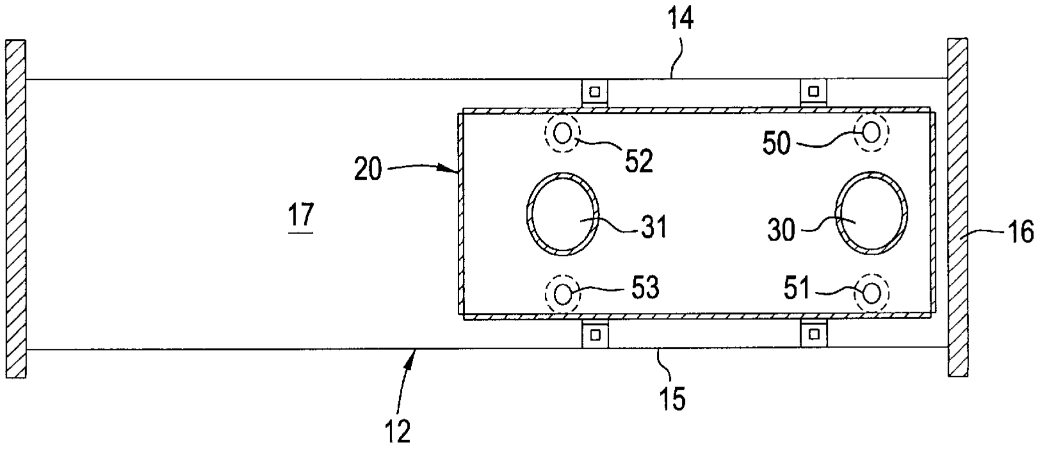
FIG. 2 is a longitudinal cross-sectional top view of the tuner section of FIG. 1 taken generally along lines 2—2 therein.
Figure 3:
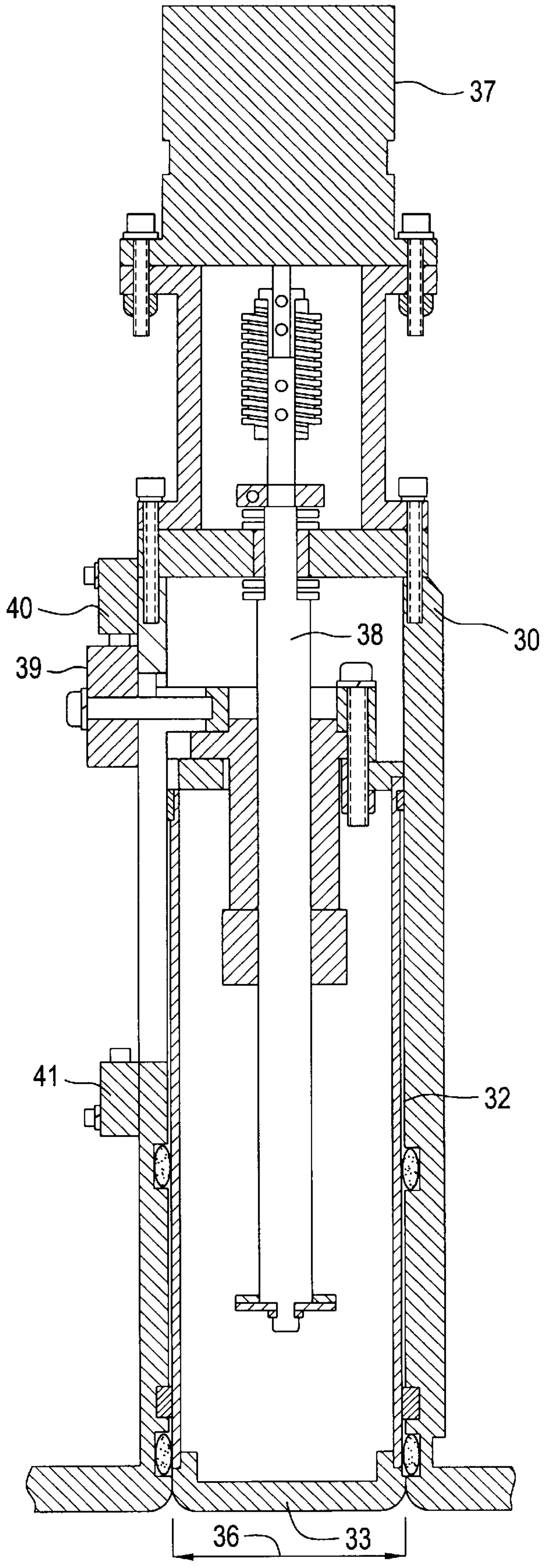
FIG. 3 is a cut-away side view of a tuning probe usable with the tuner section of FIG. 1.

In the example preferred embodiment, a rectangular waveguide is utilized. Located along this rectangular waveguide 12, there is a tuner section 20 (FIGS. 1–3). This tuner section 20 includes probe units 30, 31 that have movable probes which extend into the waveguide 12 in order to alter the various electromagnetic properties of the electromagnetic waves passing therethrough.

This present invention embodies a probe unit 30, 31 that controls a plurality of microwave or radio frequency components, uniquely configured so as to provide both the inductive and capacitive adjustment capability that is required for universal match adjustment (FIGS. 1–3). In the preferred implementation, these two necessary parameters are located at exactly the same electrical position on the waveguide 12 (transmission line). The reason for this is the inclusion of inductive posts along with the capacitive probes. Each probe unit can provide adjustment embodying both inductive and capacitive reactance or susceptance from this single physical and electrical position. These two required electrical parameters are thus available so that proper adjustment of the match quality is present and can be maintained.

In the preferred embodiment disclosed, in order to accomplish four axes tuning, two probe/inductive post units 30, 31 are utilized. The inductive posts 50–53 in these units synergistically cooperate with the capacitive probes 33–34 so as to provide for four axes tuning with only two probe units 30, 31. Although it is possible to use movement of the inductive posts 50–53 laterally of the waveguide towards and away from its respective capacitive probe 33–34 for tuning, this could present certain problems due to the high current plus the possibility of arcing at high powers. It is, therefore, preferred that the capacitive probes 33–34 be moved in order to tune the waveguide.

Figure 8:
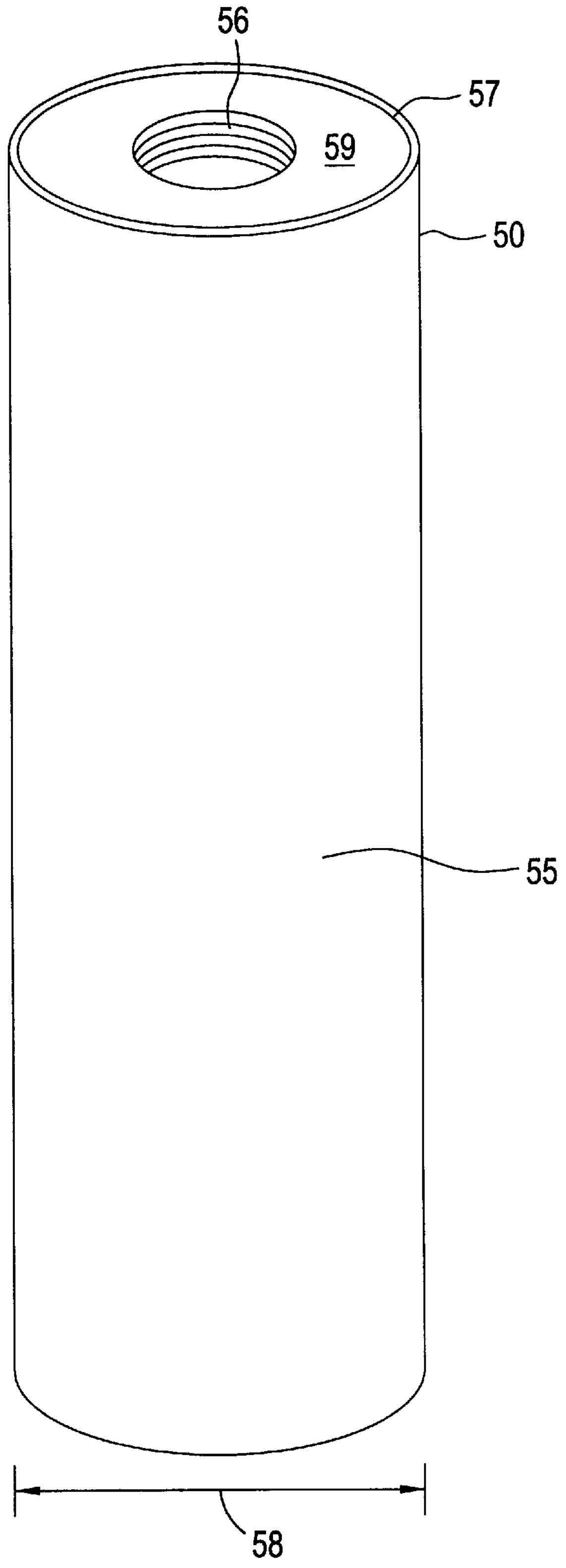

In the rectangular waveguide embodiment disclosed, the inductive posts 50–53 are fabricated such that they fit securely between the two largest dimensional or broad walls 17 of the waveguide comprising the tuner assembly (i.e., extending across the narrow dimension). The reason for the secure fit is primarily in recognition of the high surface currents that pass along the skin of the inductive posts. Although it is possible to use very thin wall tubular metal as the inductive posts (due to the skin effect involving high surface currents), it is preferred to use solid metal cylinders 55 (FIG. 8). The reason for this is the simplicity of producing a solid interconnection between the posts and waveguide, whether by bolts, welding, or other means. In the embodiment disclosed, both ends of the inductive posts are drilled and threaded such that a bolt may be used to securely fasten each of the two ends of the inductive posts to each of the two broad walls 17 of the waveguide comprising the tuner assembly. Preferably the bolt in hole 56 has an outside diameter of at least 30%, but not more than 45% that of the inductive post diameter 58. In addition to the drilled and tapped hole in each of the two ends of each inductive post, there is a contact surface 57 machined at each end of the inductive post. Preferably this contact surface 57 is designed such that all of the force generated by the fastening bolt is distributed over a limited surface beginning at the outside edge of the end of the inductive post. This increases the unit loading for a given torque of the bolt, thus to provide for better conductivity between the inductive post and the waveguide 12. Further, this conductivity is concentrated at the outer diameter of the posts, and thus at the skin that actually passes the high current thereon. This increases the efficiency of current transfer by causing a solid cylinder to function as a thin wall tube. In the embodiment disclosed, a very narrow contact surface 57 extends inward from the outer circumferential edge of the post with a relief 59 of a certain depth provided inside of this narrow contact surface 57 to ensure that substantially all of the force generated by the fastening bolt at each end of the post is distributed on the limited edge contact surface 57. This provides a secure electrical contact of the skin of the inductive posts with the inside of the two opposing broad walls 17 of the waveguide comprising the tuner assembly.

Each of the two inductive posts is fabricated preferably with at least a metal outer surface. Each post's outside diameter 58 is approximately equal to the inside dimension of the broad wall 17 of the waveguide comprising the tuner assembly multiplied by 0.154 plus or minus 0.005. Each of the two inductive posts are placed inside of the waveguide comprising the tuner assembly, with their centers located according to a dimension approximately equal to the inside dimension of the broad wall 17 of the waveguide comprising the tuner assembly multiplied by 0.180 plus or minus 0.005 from the inside surface of the inside of the lesser dimension or narrow walls of the waveguide comprising the tuner assembly. This ensures that when the capacitive probe is retracted out of the waveguide to its limit, the inductive reactance generated by the posts is equal in magnitude to the resultant capacitive reactance generated by the capacitive probe when the probe is inserted to its inner most limit. This ensures symmetry in the inductive reactance/capacitive reactance tuning range.

Note that the above multiplicands and those related to the later described probe are all interrelated in that if the user increases one, the others normally vary, and typically would have to be decreased. Further, the inductive and capacitive members would need to be altered when utilized with modes and waveguides other than the dominant rectangular waveguide mode utilized by way of example herein.

Due to the use of the posts 50–53 as inductive members for the tuning section, one parameter is automatically provided with control of another parameter. This invention, therefore, can utilize two capacitive probes 33, 34 for a complete four axes vector tuner network. This invention requires only two mechanical actuating mechanisms instead of the traditional three, four, or five embodied in the prior art. Further, only one distance 35 between two capacitive probes 33, 34 needs to be maintained instead of the three 105, 106, 107 in the four probe prior art or four in the five probe art. These combine to simplify the construction, the initial setup and subsequent usage of the tuning mechanism, thus lowering manufacturing and operational costs. In addition, the length of the tuner section 20 is significantly reduced from a conventional four probe unit. Further, since only one distance is critical, a single waveguide 12 can be utilized with differing frequencies merely by moving one probe 33 or 34 with its respective inductive posts 50–51 or 52–53 with respect to each other. This further lowers manufacturing costs. Further, one or both of the probe 33 or 34 and/or their respective inductive posts 50–51 or 52–53 can be made movable longitudinally along the waveguide 12 or even rotatable about the axis of the probe, thus introducing new control elements to the tuner section 20.

The preferred four axes embodiment of this invention has two capacitive probes 33, 34 that are spaced ⅝ wavelength apart to allow for a significant bandwidth and better performance over a wider range of frequencies. The probes themselves have at least a metal outer surface 32 and exposed end 33. A silver outer coating is preferred to lower the resistance of this critical surface. This lowers the waste heat generated on this surface. The capacitive probe itself is placed exactly in the center of the dimension spanning the broad wall 17 of the waveguide 12 comprising the tuner assembly, and has an outside diameter 36 approximately equal to the inside dimension of the broad wall 17 of the waveguide comprising the tuner assembly multiplied by 0.2318 plus or minus 0.005. The end 33 of the capacitive probe that protrudes into the waveguide comprising the tuner assembly is machined with a radius of approximately 11% of the diameter of the capacitive probe on the end circumference of the probe, to diffuse concentration of the high strength electric fields in the waveguide that are present when the tuner is operated under high power.

The probes 33, 34 yield two of the four required axes for complete vector tuning. The other two axes are supplied by two inductive posts 50–51, 52–53 that are located symmetrically on either side of each of the two capacitive probes 33, 34. Preferably, also the probes 33, 34 are located substantially perpendicular to the largest dimension wall 17 of the rectangular waveguide 12 with the inductive posts 50–51, 52–53 parallel thereto. Preferably a line through each pair of posts 50–51 and 52–53 is perpendicular to the line through the two probes 33, 34. These two symmetrically positioned inductive posts 50–51, 52–53 also increase the electric field concentration in the vicinity of their respective capacitive probe 33, 34, thereby enhancing that capacitive probe's effectiveness for a given mechanical adjustment of the probe. This greatly increases the tuning latitude and tuning range over the traditional four probe network.

Since capacitive reactance and inductive reactance are vector quantities that are opposite in direction to one another, the invention makes use of this factor. In neutral position, the capacitive probes 33, 34 are adjusted such that their capacitive reactance exactly equals the inductive reactance presented by the inductive posts 50–51, 52–53. One capacitive probe 33, 34 can then be adjusted to reduce the capacitive reactance, thereby introducing net inductive reactance into the system. The same capacitive probe 33, 34 can be adjusted so as to increase its capacitive reactance to a value that is greater than the inductive reactance value presented by the inductive posts 50–51, 52–53, thereby introducing net capacitive reactance to the system. By placing two of these identical capacitive/inductive elements ⅝ wavelength apart, a complete four axis vector tuning network is implemented using only two tuning adjustments, with much greater tuning latitude and frequency agility.

In the example device, the probe/post unit is incorporated into a tuner section 20 integral with a waveguide 12. This is preferred as reducing the number of parts contrasted with having a tuning section 20 separate from the waveguide 12. The particular tuning section 20 includes a waveguide 12 some 36" long, 4+½" high and 9" wide. This waveguide 12 serves to contain the electromagnetic microwave radiation in addition to providing a physical location for the tuning section 20.

The actual tuning is accomplished at the head end of this tuner section 20 by the combination of capacitive probes 33, 34 and inductive tuner posts 50–51, 52–53. In the particular embodiment disclosed, the inductive tuner posts 50–51, 52–53 are all aluminum cylinders some 1+½" in diameter 58 and 4+½" long. The edge contact surface 57 is about 0.075" with a relief 59 having a depth of about 0.030" comprising the rest of the surface. This is to ensure secure electrical contact as previously described. These inductive tuner posts 50–51, 52–53 are located in pairs 50–51 and 52–53 separated from the inside surface of the opposing narrow walls 14, 15 of the tuner section by substantially 1.7" with 5.3" separating each pair 50–51 and 52–53 of tuner posts. The leading set of inductive posts 50–51 is located substantially 3.6" from the head end 16 of the waveguide 12 of the tuner section 20, with the secondary set of inductive posts 52–53 being located substantially 11+½" later.

Located between the inductive tuner posts 50–51, 52–53 are the adjustable capacitive probe units 30, 31. The probe is fabricated of brass and then silver plated for high electrical conductivity. Each capacitive probe includes a movable probe 33, 34 some 2.2" in diameter 6.45" long. The end of the probe is machined to a radius of about 0.250" to diffuse the concentration of fields as previously described. This probe 33, 34 is moved under control of a stepper motor 37 and tuner screw 38 through a distance of substantially 2.64". A tripper 39 located between two microswitches 40, 41 acts as an over-travel relief mechanism to insure safe operation of the probes, preventing damage to the mechanism.

In other tuner sections, the size, location, materials and distance of travel would need to be adjusted to insure proper operation of the device.

The quantity and quality of the preferred automatic movement of the probes 33, 34 is under the control of a feedback network. This feedback network consists of a sensor 81 and a computer 80.

The sensor 81 is designed to sense the phase, magnitude, and/or other properties of waves which exist within the device preferably at a location between the electromagnetic source 60 and probe units 30, 31.

The computer 80 adjusts the vector reflection coefficient for the system in order to optimize the energy application for the device.

In respect to a reflected sensor 81 (located between the electromagnetic source and the probes), the computer 80 uses the input from the sensors 81 to adjust the standing waves for a pattern to cancel out all ineffective energy. A reflector might be located on the opposite side of the load 70 from the waveguide 12 to reflect energy back if desired.

The measurement would include both phase and magnitude measurements of the waves with the computer 80 utilizing the vector reflection/transmission coefficients to adjust the probe units 30, 31 to maximize the energy applied to the particular chosen load 70.

In the invention of this present application, the parameters for this match tuning are provided by an adjustable capacitive probe 33, 34 located between two parallel inductive posts 50–51, 52–53 at the same longitudinal location in the waveguide 12, comprising the tuner.

With this orientation, the electrical parameters can be tuned in order to minimize reflected energy, and thus match the electromagnetic field to the process. Other types of control are also possible.

In the preferred reflective embodiment, the sensor 81 senses the phase and magnitude of the reflected waves, with the computer 80 adjusting the probes 33, 34 by control of the stepper motor 37 of each unit 30, 31 in order to adjust the vector reflection coefficient for each unit thus to counteract the reflected energy. It thus adjusts the standing wave pattern to cancel ineffective radiation outward from the system.

It is preferred that a four axes system be implemented as set forth above. This is accomplished in the preferred embodiment. A two axes system using a single probe unit, for example 30, could also be implemented if desired.

Figure 5:
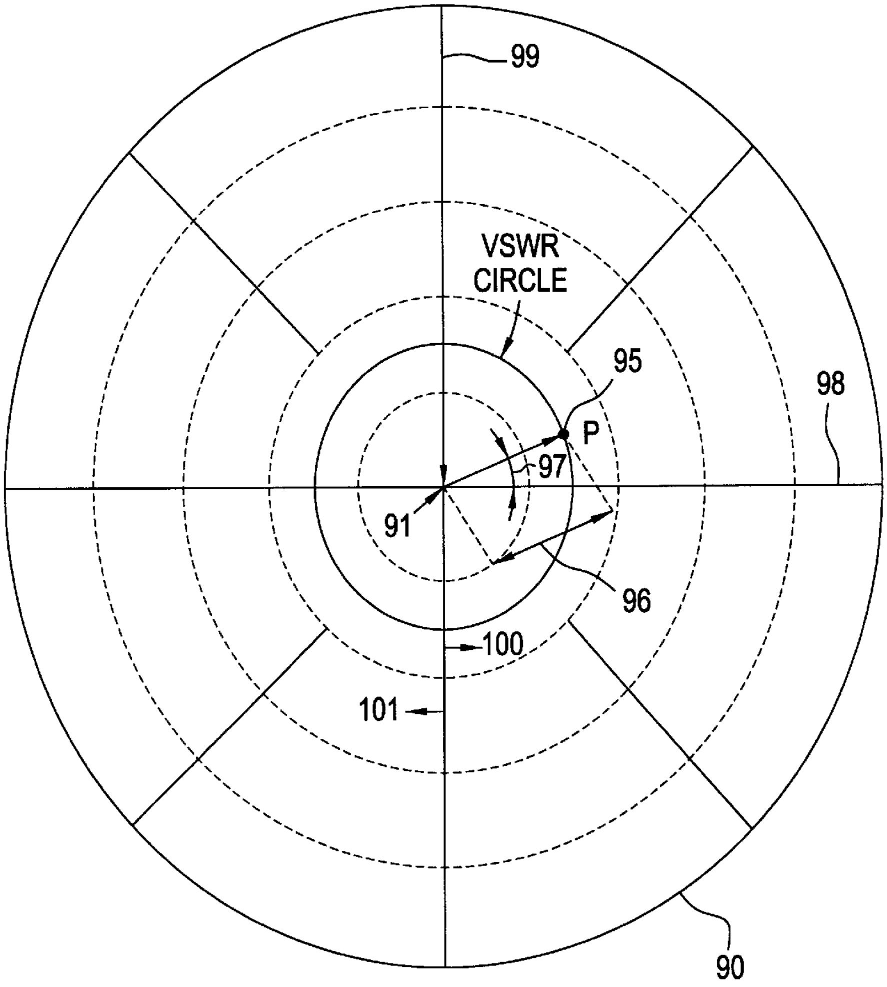
FIG. 5 is a diagram disclosing the two dimensional vector adjustment range of the preferred embodiment of the invention.
Figure 6:
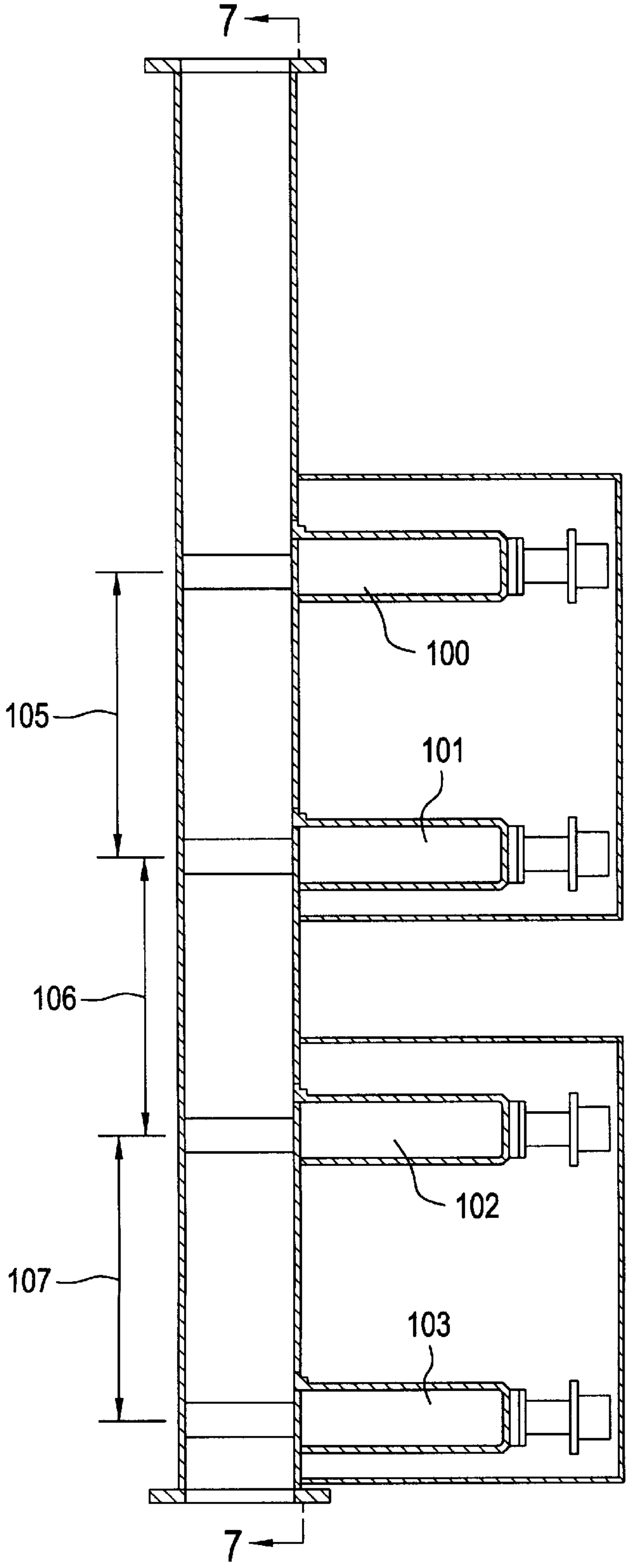
FIG. 6 is a longitudinal cross-sectional side view of a traditional prior art four probe rectangular waveguide tuner network.
Figure 7:
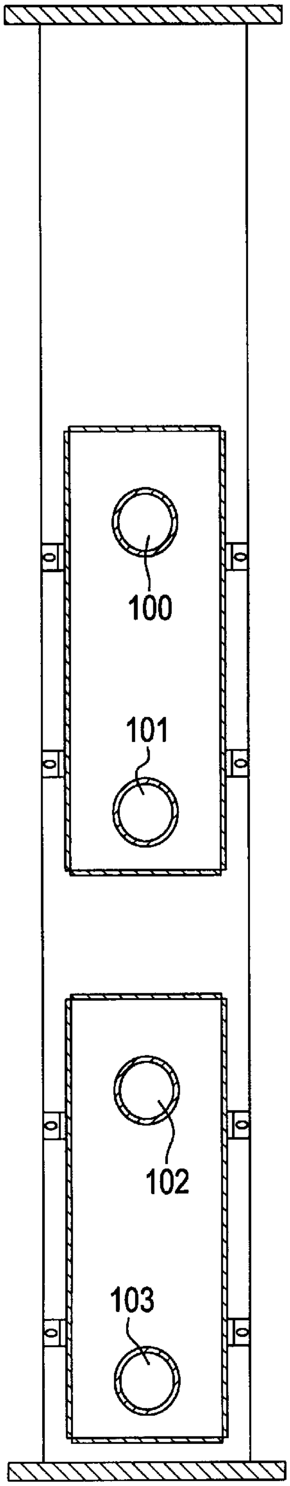
FIG. 7 is a longitudinal cross-sectional top view of the tuner section of the prior art FIG. 6 taken generally along lines 7—7 therein; and, FIG. 8 is a perspective view of one of the inductive posts utilized in the waveguide FIGS. 1 and 2.

In this preferred application of microwave or radio frequency technology, the quality of the match between the electromagnetic energy and the substrate can be illustrated on a diagram as a Polar Reflection Coefficient Diagram 90 (FIG. 5). Here, the optimum match quality that illustrates the most efficient and effective system operation is presented when the Polar Reflection Coefficient 95 is located at the center 91 of the diagram. Any displacement of the Polar Reflection Coefficient Coordinate 95 from the center 91 of the diagram 90 constitutes a less than optimum match between the actual microwave or radio frequency energy and the process load or substrate. As the name implies, the Reflection Coefficient 95 is a measure of the portion of the microwave or radio frequency energy that is incident on the process substrate that is reflected from the process substrate, and thus not used, as a result of a less than optimum match condition. This coordinate is a vector quantity, meaning that it has both a magnitude and a direction associated with it. Here, the magnitude is illustrated by the length 96 of the vector from the center 91 of the diagram, and the direction is illustrated by the phase angle 97 between the horizontal "X" axis 98 and the radius vector to the coordinate 95, as shown.

In this microwave or radio frequency tuning network, parameters are introduced and vector quantities are adjusted as described above. Each axis on the diagram can represent the intentionally introduced capacitive and/or inductive reactance from the tuning network. Pure inductive reactance can be represented by a positive displacement to the right 100 from the origin, along the "X" axis of the diagram in FIG. 5. Pure capacitive reactance is the vector negative of inductive reactance, and hence can be represented by negative displacement to the left 101 from the origin along the "X" axis. Two inductive/capacitive reactance element centers in the tuner network 20 can be electrically located with respect to one another such that one axis on the diagram of the tuner is located 90°with respect to the other. The second reactance center would move up and down vertically along the vertical "Y" axis 99. It can now be seen that by adjusting the two probes on the tuner, an intentionally synthesized four axes control parameter is introduced.

These intentionally introduced complex microwave or radio frequency parameters then add vectorally with the reflection vector from the process substrate, and can be adjusted such that the system resultant reflection coefficient is zero. This constitutes the optimum system tuned condition. As can now be seen, the tuner must be capable of synthesizing complex vector reflections that are able to be added to the reflections from the process substrate. The resultant is an almost complete cancellation of the aggregate reflection from the system.

Although the invention has been described in its preferred form with a certain degree of particularity, it is to be understood that numerous changes can be made without deviating from the invention as hereinafter claimed.

For example, if desired, a third capacitive probe/inductive post probe unit could be added, for example equally spaced and dimensioned in series with the two units 30, 31 in the preferred rectangular waveguide system. This would be particularly applicable for extremely high magnitude reflection correction at all phase angles. Other modifications are also possible without deviating from the invention as claimed.

What is claimed:

1. In an electromagnetic processing system including a waveguide and a tuner network including at least two alterable capacitive members, the improvement of said at least two capacitive members being axially spaced in respect to the waveguide, for each said capacitive member there are a pair of inductive members, each pair of said inductive members being laterally located substantially perpendicular of a plane running through said alterable capacitive members, each of said inductive members having a longitudinal axis, and said pair of inductive members being located in the waveguide substantially laterally beside said respective capacitive member with said longitudinal axis of said inductive members being located substantially parallel to said longitudinal axis of said respective capacitive member.

2. The system of claim 1 characterized in that said pair of inductive members are located on opposite sides of its respective alterable capacitive member.

3. The system of claim 1 characterized in that the waveguide has a rectangular lateral cross section, said rectangular cross section having a largest dimension wall, said capacitive member having a longitudinal axis, and said longitudinal axis of said capacitive member extending substantially perpendicular to said largest dimension wall.

4. The system of claim 1 characterized in that the waveguide has a rectangular lateral cross section with opposing walls and said inductive members extending across the waveguide between said larger dimension opposing walls.

5. The system of claim 1 characterized in that the waveguide has a circular lateral cross section and said capacitive members being probes located symmetrically in respect to said circular cross section.

6. The system of claim 1 characterized in that the waveguide has a wall and each of said pair of inductive members is located between their respective said capacitive member and said wall.

7. A system for processing a substrate with an electromagnetic field comprising an electromagnetic generator, said electromagnetic generator producing an electromagnetic field directed through a waveguide, said electromagnetic field having electrical parameters, a tuner network, said tuner network being connected to said waveguide to control said electrical parameters of said electromagnetic field, said tuner network including two capacitive members, said two capacitive members being in said waveguide, said tuner network further including a pair of inductive members for each said capacitive member, each said pair of inductive members being located adjacent to its respective said capacitive member in said waveguide symmetrically on opposite sides of their respective capacitive probe and laterally of a line running through said least two capacitive members at a point coextensive with the longitudinal axis of their respective capacitive member, said two capacitive members and said two inductive members effecting said electrical parameters of said electromagnetic field, and said tuner network altering said electromagnetic field based upon the movement of one or both of said two capacitive members.

8. The system of claim 7 characterized in that said electrical parameters include energy reflected from the substrate and said optimizing said electromagnetic field includes adjusting said reflected energy to substantially zero to match said electromagnetic field to the process.

9. The system of claim 7 characterized in that said two inductive members each are a pair of posts located laterally of a line running through said two capacitive members.

10. The system of claim 7 characterized in that said inductive members are fixed to said waveguide.

11. The system of claim 7 characterized in that the waveguide has a rectangular lateral cross section, said rectangular cross section having a largest dimension wall, said capacitive member having a longitudinal axis, and said longitudinal axis of said capacitive member extending substantially perpendicular to said largest dimension wall.

12. The system of claim 7 characterized in that the waveguide has a circular lateral cross section and said capacitive member being a probe located symmetrically in respect to said circular cross section.

13. The system of claim 9 characterized in that said pair of posts of said two inductive members are located symmetrically on at least opposite sides of their respective capacitive member laterally of a line running through said two capacitive members.

14. A system for processing a substrate with an electromagnetic field comprising an electromagnetic generator, said electromagnetic generator producing an electromagnetic field directed through a rectangular cross section waveguide, the waveguide having a broadest wall dimension, said electromagnetic field having electrical parameters, a tuner network, said tuner network being connected to said waveguide to control said electrical parameters of said electromagnetic field, said tuner network including two capacitive probes, said two capacitive probes being in said waveguide extending perpendicular to said broadest wall, said tuner network further including two pairs of inductive posts, each said pair of inductive posts being located adjacent to said two capacitive probes respectively in said waveguide symmetrically on opposite sides of their respective capacitive probe and laterally of a line running through said least two capacitive probes at the intersection of said line and said respective probe, said two capacitive probes and said two inductive posts effecting said electrical parameters of said electromagnetic field, and said tuner network altering said electromagnetic field based upon the movement of one or both of said two capacitive probes.

15. The system of claim 14 characterized in that said electrical parameters include energy reflected from the substrate and said optimizing said electromagnetic field includes adjusting said reflected energy to substantially zero to match said electromagnetic field to the process.

16. The system of claim 14 characterized in that each of said pair of inductive posts are located laterally of a line running through said two capacitive probes respectively.

17. The system of claim 14 characterized in that said pair of inductive posts are fixed to said waveguide.

18. The system of claim 14 characterized in that said electromagnetic parameters includes wavelength, said two capacitive probes being separated by a distance, and said distance being set by a function of said wavelength.

19. The system of claim 18 characterized in that said distance is physically set by the physical location of said two capacitive probes in respect to said waveguide.

20. The system of claim 18 characterized in that said distance is electrically set by said tuner network.

21. The system of claim 18 characterized in that said electromagnetic field parameters includes capacitive reactance and inductive reactance.

22. The system of claim 21 characterized in that said capacitive reactance and said inductive reactance are adjusted to be substantially equal with no reflection from the process substrate.

* * * * *